(12) United States Patent
Kreger et al.

(10) Patent No.: US 7,573,259 B1
(45) Date of Patent: Aug. 11, 2009

(54) MULTI-TRACK SENSE MAGNET WITH REDUCED CROSS-TALK

(75) Inventors: Scott P. Kreger, Springfield, OH (US); Daniel L. Kottmyer, Springfield, OH (US)

(73) Assignee: Globe Motors, Inc., Dayton, OH (US)

( * ) Notice: Subject to any disclaimer, the term of this patent is extended or adjusted under 35 U.S.C. 154(b) by 0 days.

(21) Appl. No.: 12/103,469

(22) Filed: Apr. 15, 2008

(51) Int. Cl.
*G01B 7/14* (2006.01)
*G01R 33/12* (2006.01)

(52) U.S. Cl. .................................. 324/207.22; 324/210

(58) Field of Classification Search ......... 324/173–174, 324/207.22–207.23, 207.25, 210–213; 73/514.31, 73/514.39; 369/13.02, 13.11–13.17, 13.2, 369/13.22, 13.35–13.38, 13.4, 13.49, 53.25, 369/53.29, 53.38
See application file for complete search history.

(56) References Cited

U.S. PATENT DOCUMENTS

| | | | | |
|---|---|---|---|---|
| 4,209,810 A | * | 6/1980 | Ragle et al. | 360/77.06 |
| 4,458,275 A | * | 7/1984 | Monti | 360/78.08 |
| 4,792,788 A | | 12/1988 | Kumar | |
| 7,196,527 B2 | | 3/2007 | Stridsberg | |
| 7,486,206 B2 | * | 2/2009 | Kahlman | 341/51 |
| 2007/0216544 A1 | | 9/2007 | Dalton | |

* cited by examiner

*Primary Examiner*—Bot LeDynh
(74) *Attorney, Agent, or Firm*—Stevens & Showalter LLP

(57) ABSTRACT

A multi-track sense magnet for use in a system for sensing the relative displacement of two elements, and including a magnetic structure that is moveable relative to detector devices for detecting movement of the magnetic structure. The magnetic structure includes at least a first track and a second track extending generally parallel to each other, each track including a plurality of sectors of alternating magnetic poles. A blocker track is located between the first and second tracks, wherein the blocker track includes a predetermined number of sectors corresponding to the number of sectors on the first track. Each sector of the blocker track is aligned with and defines an opposite magnetic pole to an adjacent sector of the first track to alter the magnetic field of the first track extending toward the second track.

22 Claims, 2 Drawing Sheets

MULTI-TRACK SENSE MAGNET WITH REDUCED CROSS-TALK

FIELD OF THE INVENTION

The present invention generally relates to position encoders and, more particularly, to position encoders comprising a multi-track sense magnet structure having reduced cross-talk between tracks.

BACKGROUND OF THE INVENTION

Position encoders are used in a variety of applications to provide feedback identifying the position of a moveable member. Such moveable members are often used to identify the position and/or velocity of rotatable members, such as a steering wheel for a vehicle, a rotor shaft in a brushless motor, or other structures in which the position and/or velocity of a rotating member relative to a stationary member needs to be tracked or identified. In addition, encoders may also be implemented in applications for tracking linear movement of moveable members.

One commonly used encoder comprises a magnet structure including a sense magnet that is moveable relative to a sensor. In particular, in a known sense magnet assembly, a continuous annular ring of magnet material is assembled to a structure supported on a rotatable shaft. The magnet material is magnetized to provide a plurality of circumferential patterns defined at different diametric locations within the magnet material. For example, the magnet material may be magnetized to define a dual track sense magnet including an inner magnetic track and an outer magnetic track located radially outwardly from the inner track. The inner track may comprise a first number of sectors defined by a plurality of alternating magnetic poles, and the outer track may comprise a second number of sectors defined by a plurality of alternating magnetic poles, where the second number of sectors is larger than the first number of sectors. A Hall device is located adjacent to each of the tracks to detect transitions between the alternating poles defining the sectors. That is, the Hall devices detect switches between the alternating magnetic poles within a switching zone around the zero Gauss crossing of each transition of the magnet material's magnetic flux pattern.

As shown in FIG. 4B, for example, there is a transition slope in the flux density proceeding from one magnetic pole to an adjacent magnetic pole. Further, the switching zone results from a characteristic of the Hall devices in that a Hall device does not change state or detect a switch in flux direction exactly at zero Gauss, but instead has some difference or hysteresis between the operating and switching points of the Hall device. The accuracy of the encoder is directly affected by the width of the switching zones. Hence, it is desirable for the slope of the flux density to be a steep as possible such that the width of each switching zone is minimized.

The width of the switching zone is a function of several variables including the characteristics of the magnet material compound itself, the magnetization process used to define the poles, the characteristics of the particular Hall device(s) used, the proximity of the Hall device(s) to the magnet material, as well as other factors. In addition, in a multi-track sense magnet in which the magnetic tracks are located adjacent to each other, magnetic "cross-talk" typically occurs in which the magnetic field of a first magnetic track alters the magnetic field of an adjacent second magnetic track and adversely affects the switching zone detected by the Hall device(s), with an associated decrease in detection accuracy.

SUMMARY OF THE INVENTION

The present invention provides a multi-track sense magnet for use in a system for sensing the relative displacement of two elements, providing control of cross-talk between the magnetic tracks of the sense magnet.

In accordance with one aspect of the invention, a magnetic structure is provided for use in a system for sensing the relative displacement between first and second members. The system comprises at least two detector devices for sensing variations in magnetic properties of the magnetic structure, and the magnetic structure includes a plurality of encoding tracks comprising at least a first track and a second track extending generally parallel to each other. The first track has a first predetermined number of sectors and the second track has a second predetermined number of sectors. Each of the sectors define a magnetic pole facing toward a respective one of the detector devices. Each of the first and second tracks pass within a triggering range of a respective one of the detector devices for causing the respective one of the detector devices to produce a signal upon sensing a transition between adjacent sectors in a respective track. A blocker track is located between the first and second tracks, wherein the blocker track includes a predetermined number of sectors corresponding to the number of sectors on the first track, each sector of the blocker track being aligned with and comprising an opposite magnetic pole to an adjacent sector of the first track.

In accordance with another aspect of the invention, a magnetic structure is provided for use in a system for sensing the relative displacement between first and second members. The system comprises at least two detector devices for sensing variations in magnetic properties of the magnetic structure, and the magnetic structure includes a plurality of concentric, annular encoding tracks comprising at least a first track and a second track. The first track has a first predetermined number of sectors and the second track has a second predetermined number of sectors. Each of the sectors define a magnetic pole facing toward a respective one of the detector devices, wherein the sectors of the first track form a stronger magnetic field than the sectors of the second track. Each of the first and second tracks pass within a triggering range of a respective one of the detector devices for causing the respective one of the detector devices to produce a signal upon sensing a transition between adjacent sectors in a respective track. A blocker track is located between the first and second tracks, wherein the blocker track includes a predetermined number of sectors corresponding to the number of sectors on the first track, each sector of the blocker track being aligned with and comprising an opposite magnetic pole to an adjacent sector of the first track.

BRIEF DESCRIPTION OF THE DRAWINGS

While the specification concludes with claims particularly pointing out and distinctly claiming the present invention, it is believed that the present invention will be better understood from the following description in conjunction with the accompanying Drawing Figures, in which like reference numerals identify like elements, and wherein:

DETAILED DESCRIPTION OF THE INVENTION

In the following detailed description of the preferred embodiment, reference is made to the accompanying drawings that form a part hereof, and in which is shown by way of illustration, and not by way of limitation, a specific preferred embodiment in which the invention may be practiced. It is to be understood that other embodiments may be utilized and that changes may be made without departing from the spirit and scope of the present invention.

Figure 1:
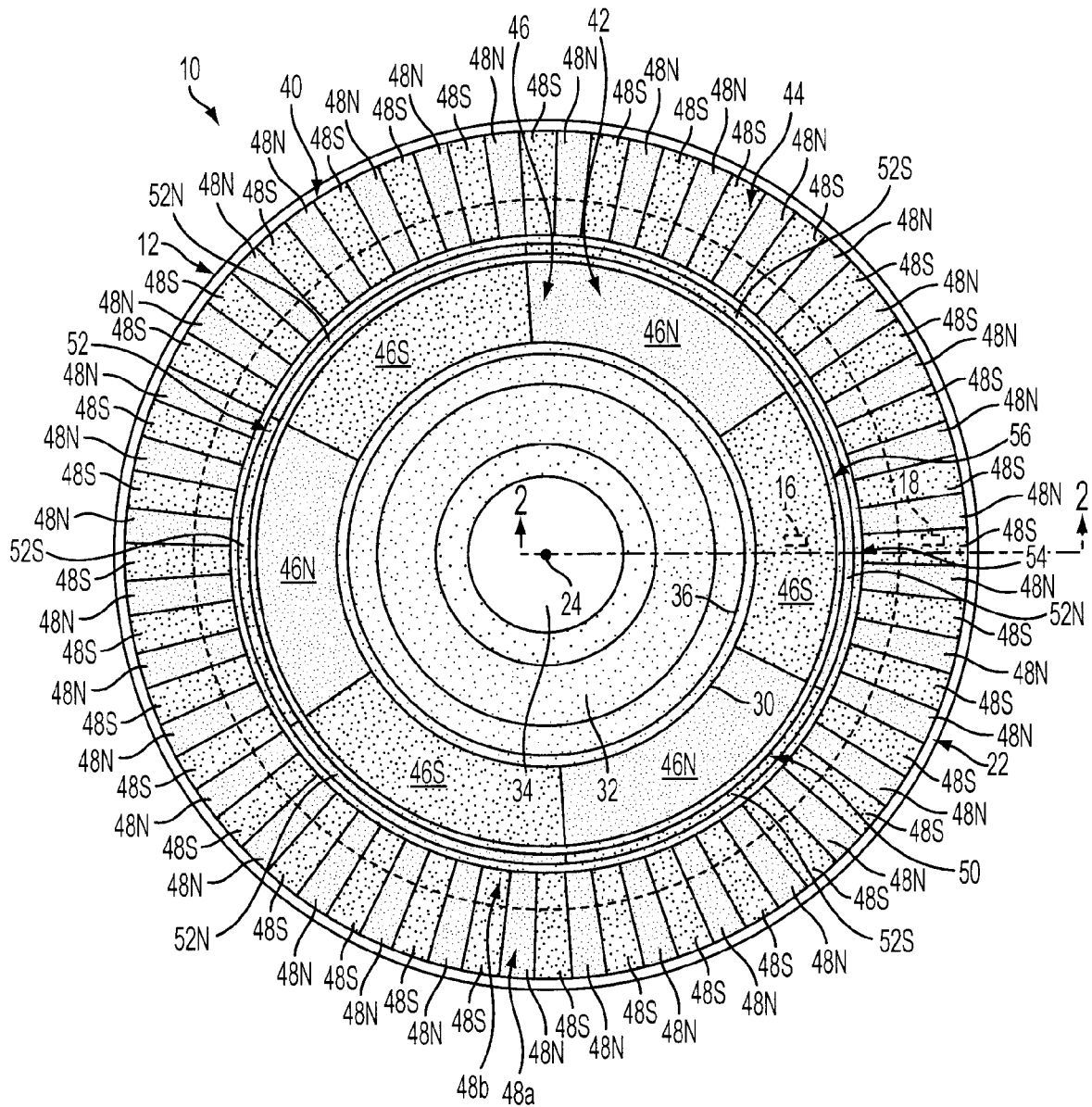
FIG. 1 is a plan view of a system including a magnetic structure constructed in accordance with the present invention.
Figure 2:
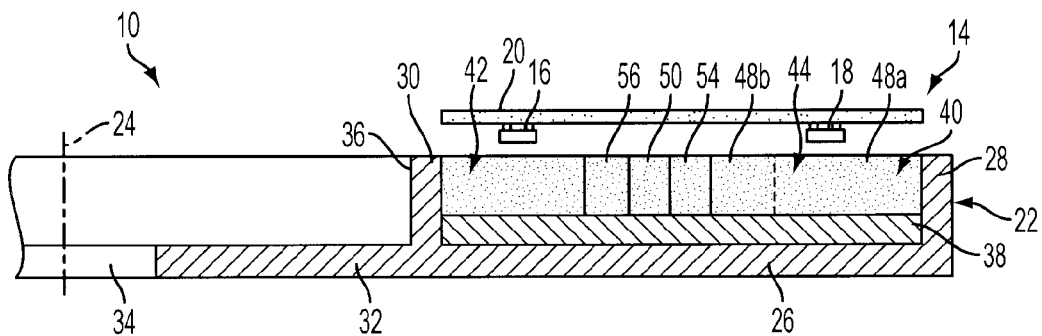
FIG. 2 is an enlarged cross-sectional view taken along line 2-2 in FIG. 1.

Referring to FIGS. 1 and 2, the present invention comprises a system 10 for sensing the relative displacement between first and second members, such as a system forming an encoder for sensing the movement of a rotating shaft member. In particular, the system 10 includes a first member comprising a magnetic structure 12 movable relative to a second member comprising at least a sensor structure 14, having detector devices which may comprise first and second Hall sensors or devices 16, 18 mounted to a printed circuit board (PCB) 20 and located adjacent to the magnetic structure 12, as is described further below.

The magnetic structure 12 comprises a sense magnet assembly including a generally circular hub portion 22 defining a central rotational axis 24. The hub portion 22 is formed of a non-magnetic material, such as aluminum, and comprises a generally disk-shaped base portion 26, an outer wall 28, and an inner wall 30. An additional portion 32 of the base portion 26 may extend radially inwardly to define an aperture 34 for receiving and rigidly attaching to a shaft (not shown). Alternatively, an inner surface 36 of the inner wall 30 may define the aperture 34. It should be understood that the present invention is not limited to the particular structure of the hub portion 22 disclosed herein and that other structures may be incorporated for the hub portion 22 without departing from the scope of the invention.

The magnetic structure 12 may further include a ferrous portion 38 comprising a back iron, such as a steel back iron, supported on the base portion 26, and a magnet portion 40 supported on the ferrous portion 38 between the outer wall 28 and the inner wall 30. The magnet portion 40 in the illustrated embodiment may comprise a permanent magnet material or other material capable of being selectively magnetized.

The magnet portion 40 is selectively magnetized to define a plurality of distinct encoding tracks located at predetermined radial locations and generally parallel to each other. In the illustrated embodiment, the magnet portion 40 includes parallel first and second tracks 42, 44, comprising generally continuous annular strips or regions defined concentrically on the magnet portion 40. The first track 42 is defined at a radially inner location on the magnet portion 40, and the second track 44 is defined at a radially outer location on the magnet portion 40. The first track 42 includes a predetermined number of radially extending first sectors 46 that are magnetized in the axial direction, as defined by the axis 24 of the hub portion 22. The first sectors 46 comprise circumferentially alternating north pole sectors 46N and south pole sectors 46S.

The second track 44 includes a predetermined number of radially extending second sectors 48 that are magnetized in the axial direction, as defined by the axis 24 of the hub portion 22. The second sectors 48 comprise circumferentially alternating north pole sectors 48N and south pole sectors 48S. In the illustrated embodiment, the first track 42 comprises a low resolution track with a relatively low number of first sectors 42, and the second track 44 comprises a relatively large number of second sectors 48. It should be understood that the present invention is not limited to particular number of sectors 46, 48 described herein, and that the first track 42 could be formed as a high resolution track having more sectors 46 than the number of sectors 48 in the second track 44, or the first and second tracks 42, 44 may be formed with the same number of sectors 46, 48.

The PCB 20 supports the Hall devices 16, 18 such that the first Hall device 16 is located over a portion of the first track 42 for sensing transitions between the north pole sectors 46N and the south pole sectors 46S. Similarly, the second Hall device 18 is located over a portion of the second track 44 for sensing transitions between the north pole sectors 48N and south pole sectors 48S. That is, the first and second sectors 46, 48 pass within a triggering range of the respective Hall devices 16, 18 for sensing the rotational movement of the magnetic structure 12, such that the Hall devices 16, 18 produce signals corresponding to changes in flux density levels indicative of the transitions between poles on the sectors 46, 48.

As noted above with regard to prior art devices, the magnetic field associated with the magnetic sectors of one track may alter the magnetic field of an adjacent magnetic track. The present invention addresses this condition by providing an additional track comprising a blocker track 50 circumscribing an outer circumference of the first track 42 at a location between the first and second tracks 42, 44. In the present illustrated embodiment, the first track 42 has a stronger magnetic field than the second track 44, and the blocker track 50 is provided to at least partially block the effect of the magnetic field of the first track 42 from altering the magnetic field of the second track 44.

The blocker track 50 comprises a predetermined number of blocker sectors 52 extending radially between the first and second tracks 42, 44, and which are magnetized in the axial direction. The blocker sectors comprise circumferentially alternating north pole sectors 52N and south pole sectors 52S. In accordance with the disclosed embodiment, the number of blocker sectors 52 correspond to the number of first sectors 46. Further, each blocker sector 52 is aligned adjacent to a first sector 46, where the north pole sectors 52N of the blocker track 50 are aligned adjacent to the south pole sectors 46S of the first track 42, and the south pole sectors 52S of the blocker track 50 are aligned adjacent to the north pole sectors 46N of the first track 42. Accordingly, the field of the blocker track sectors 52 blocks or substantially alters the magnetic field extending from the first track 42 toward the second track 44, reducing the amount of cross-talk between the first track sectors 46 and the second track sectors 48.

The blocker track 50 is preferably separated from the second track 44, i.e., the weaker track, by a first annular non-magnetized area 54 to minimize the magnetic effects, such as cross-talk, between the blocker track 50 and the second track 44. In addition, a second annular non-magnetized area 56 may also be provided between the blocker track 50 and the first track 42.

Cross-talk between the first and second tracks 42, 44 may be minimized or reduced further by defining an additional region, located radially between the sensing locations of the first and second Hall devices 16, 18, and separating a sensed area of the second track 44 from the first track 42 and the blocker track 50. Specifically, the sectors 48 of the second track 44 may define a first, sensing region 48a and a second, buffer region 48b. The buffer region 48b comprises an annular, radially inner portion of the magnetized sectors 48 of the second track 44 that is substantially located outside of the triggering range of the Hall devices 16, 18, and, in particular, is located outside of the triggering range of the second Hall device 18. For example, the second Hall device 18 may be positioned at a radial location that will not be triggered by a radially inner portion of the second track 44. Hence, the buffer region 48b is a predetermined portion of the second track 44 that is adjacent to the blocker track 50 and that is not required for triggering or switching of the Hall devices 16, 18. Both the blocker track 50 and the buffer region 48b work together to minimize or reduce the cross-talk that may otherwise occur between the magnetically stronger first track 42 and the magnetically weaker second track 44.

Figure 3A:
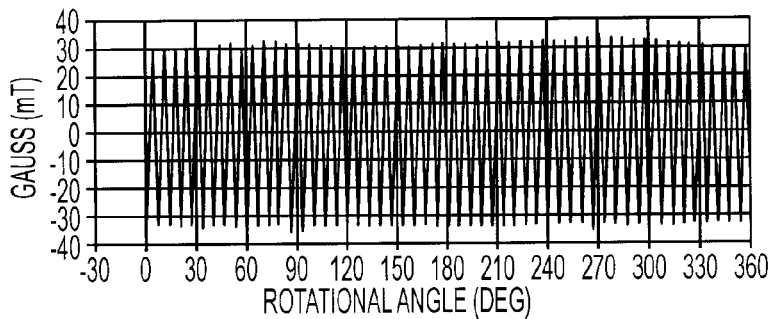
FIG. 3A illustrates a representative optimum plot of changing flux density levels for a magnetically weak track that is substantially unaffected by an adjacent magnetically strong track.
Figure 3B:
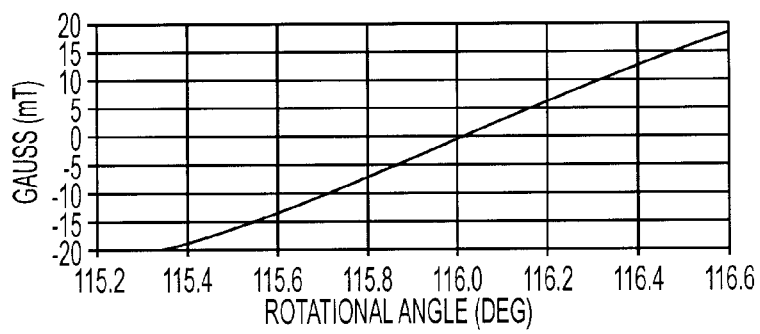
FIG. 3B is a plot showing a transition through zero Gauss of one of the switching events of FIG. 3A corresponding to a transition between adjacent north and south poles.

Referring to FIGS. 3A and 3B, a representative plot is shown generally characterizing a small alteration of changing flux density levels resulting from a weak magnetic track that is substantially unaffected by a stronger adjacent magnetic track. The plot of FIG. 3A shows multiple switching events over a revolution of a magnetic structure, and the plot of FIG. 3B shows a transition through zero Gauss of one of the switching events of FIG. 3A corresponding to a transition between adjacent north and south poles.

Figure 4A:
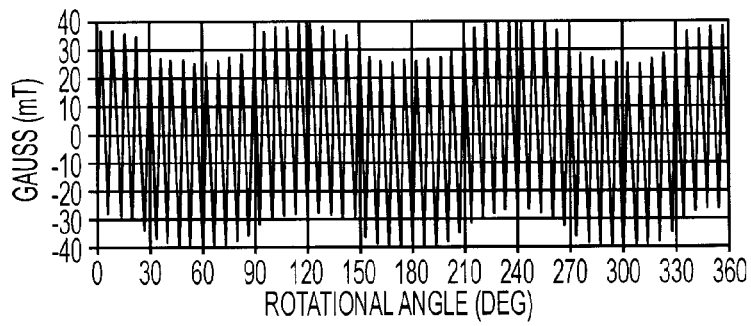
FIG. 4A is a representative plot that generally characterizes a substantial alteration of changing flux density levels resulting from a weak magnetic track that is substantially affected by a stronger adjacent magnetic track.
Figure 4B:
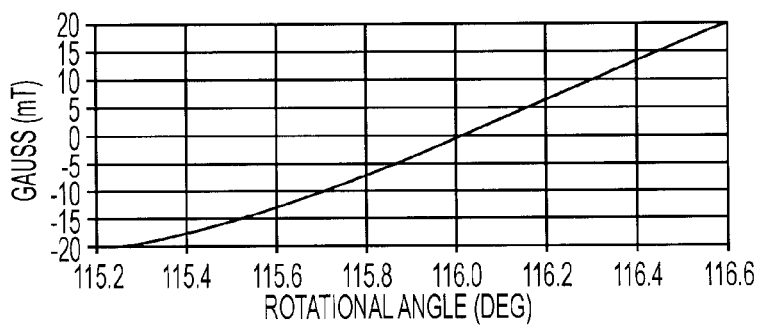
FIG. 4B is a plot showing a transition through zero Gauss of one of the switching events of FIG. 4A corresponding to a transition between adjacent north and south poles.

The plots of FIGS. 3A and 3B may be compared to the plots of FIGS. 4A and 4B, showing a representative plot that generally characterizes a substantial alteration of changing flux density levels resulting from a weak magnetic track that is substantially affected by a stronger adjacent magnetic track. The effects of the stronger magnetic track may result in cross-talk evidenced by a larger sine wave that is superimposed on the changing flux density levels of the weaker track, i.e., a shift in the flux density levels of the weaker track, as seen in FIG. 4A. The shift in the flux density levels results in a less steep flux density slope for the transitions or switching zones between adjacent magnetic sectors, as seen in FIG. 4B, which can translate into a less accurate sensing of the switching event. The present invention is intended to counteract the effects illustrated in FIGS. 4A and 4B, and provide a steeper flux density slope at the transitions between adjacent magnetic sectors. It should be understood that within the spirit and scope of the present invention, the disclosed structure of the invention may provide various degrees of improved accuracy in sensing transitions between sectors by providing an increased or steeper flux density slope, without necessarily obtaining the optimized results illustrated in FIGS. 3A and 3B.

Although the embodiment described herein locates the magnetically weaker track radially outwardly from the magnetically stronger track, it should be understood that the stronger track may be located radially outwardly from the weaker track, in which case the blocker track located between the weaker and stronger tracks would have sectors that have opposite polarity to corresponding sectors located radially outwardly in the stronger track. Also, the magnetic structure 12 may be provided with a greater number of magnetic tracks than the two tracks 42, 44 illustrated herein, including a plurality of blocker tracks, buffer regions, and non-magnetized areas located between adjacent pairs of tracks.

It should be noted that the magnet portion 40 is preferably formed of a single or continuous magnetic member, that is substantially homogenous, and that is selectively magnetized to define the sectors 46, 48 of the first and second tracks 42, 44, the blocker track 50 and the non-magnetized areas 54, 56. Alternatively, the different tracks and areas defined on the magnet portion 40 may be formed by separate components that are assembled together to define the magnet portion 40 and may be magnetized either before or after assembly into the magnet portion 40.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

The invention claimed is:

1. In a system for sensing the relative displacement between first and second members, a magnetic structure and at least two detector devices for sensing variations in magnetic properties of the magnetic structure, the magnetic structure comprising:
   a plurality of encoding tracks comprising at least a first track and a second track mounted for rotation about a central rotational axis, the first and second tracks being located at respective predetermined radial locations relative to the central rotational axis and extending generally parallel to each other;
   the first track having a first predetermined number of sectors and the second track having a second predetermined number of sectors, each sector defining a magnetic pole facing toward a respective one of the detector devices;
   each of the first and second tracks passing within a triggering range of a respective one of the detector devices for causing the respective one of the detector devices to produce a signal upon sensing a transition between adjacent sectors in a respective track; and
   a blocker track located between the first and second tracks, wherein the blocker track includes a predetermined number of sectors corresponding to the number of sectors on the first track, each sector of the blocker track being aligned with and comprising an opposite magnetic pole to an adjacent sector of the first track.

2. The magnetic structure of claim 1, wherein the first and second tracks each comprise a generally continuous strip of magnetic material.

3. The magnetic structure of claim 1, wherein the blocker track is located substantially outside of the triggering range of each of the detector devices.

4. The magnetic structure of claim 1, wherein each of the sectors of the second track includes a first, sensing region and a second, buffer region defined on the sector and extending in an area between the at least two detector devices, the buffer region being substantially outside of the triggering range of each of the detector devices.

5. The magnetic structure of claim 4, wherein the buffer region comprises a magnetized area of each of the sectors of the second track located adjacent to the blocker track.

6. The magnetic structure of claim 1, including a first area of non-magnetized material located between the blocker track and the second track.

7. The magnetic structure of claim 6, including a second area of non-magnetized material located between the blocker track and the first track.

8. The magnetic structure of claim 1, wherein the first and second tracks comprise concentric, annular members.

9. The magnetic structure of claim 8, wherein the first track comprises an inner track and the second track comprises an outer track, and the sectors of the first track form a stronger magnetic field than the sectors of the second track.

10. The magnetic structure of claim 9, wherein the blocker track is not within the triggering range of any of the detector devices in the system.

11. The magnetic structure of claim 1, wherein the second predetermined number of sectors is different from the first predetermined number of sectors.

12. In a system for sensing the relative displacement between first and second members, a magnetic structure and at least two detector devices for sensing variations in magnetic properties of the magnetic structure, the magnetic structure comprising:
- a plurality of concentric, annular encoding tracks comprising at least a first track and a second track;
- the first track having a first predetermined number of sectors and the second track having a second predetermined number of sectors, each sector defining a magnetic pole facing toward a respective one of the detector devices, wherein the sectors of the first track form a stronger magnetic field than the sectors of the second track;
- each of the first and second tracks passing within a triggering range of a respective one of the detector devices for causing the respective one of the detector devices to produce a signal upon sensing a transition between adjacent sectors in a respective track; and
- a blocker track located between the first and second tracks, wherein the blocker track includes a predetermined number of sectors corresponding to the number of sectors on the first track, each sector of the blocker track being aligned with and comprising an opposite magnetic pole to an adjacent sector of the first track.

13. The magnetic structure of claim 12, wherein each of the sectors of the second track include a first, sensing region and a second, buffer region defined on the sector and extending in an area between the at least two detector devices, the buffer region being substantially outside of the triggering range of each of the detector devices.

14. The magnetic structure of claim 13, wherein the buffer region comprises a magnetized area of each of the sectors of the second track located adjacent to the blocker track.

15. The magnetic structure of claim 14, including a first annular area of non-magnetized material located between the blocker track and the second track.

16. The magnetic structure of claim 15, including a second annular area of non-magnetized material located between the blocker track and the first track.

17. The magnetic structure of claim 14, wherein the first track comprises an inner track and the second track comprises an outer track.

18. The magnetic structure of claim 12, wherein the second track comprises a greater number of sectors than the first track.

19. The magnetic structure of claim 12, wherein the sectors of each of the first and second tracks and the blocker track comprise alternating north and south poles.

20. The magnetic structure of claim 12, wherein the blocker track is not within the triggering range of any of the detector devices in the system.

21. The magnetic structure of claim 12, wherein the second predetermined number of sectors is different from the first predetermined number of sectors.

22. In a system for sensing the relative displacement between first and second members, a magnetic structure and at least two detector devices for sensing variations in magnetic properties of the magnetic structure, the magnetic structure comprising:
- a plurality of encoding tracks comprising at least a first track and a second track;
- the first track having a first predetermined number of sectors and the second track having a second predetermined number of sectors, each sector defining a magnetic pole facing toward a respective one of the detector devices;
- each of the first and second tracks passing within a triggering range of a respective one of the detector devices for causing the respective one of the detector devices to produce a signal upon sensing a transition between adjacent sectors in a respective track; and
- a blocker track located between the first and second tracks, wherein the blocker track includes a predetermined number of sectors corresponding to the number of sectors on the first track, each sector of the blocker track being aligned with and comprising an opposite magnetic pole to an adjacent sector of the first track wherein the blocker track is located substantially outside of the triggering range of each of the detector devices.

* * * * *